United States Patent
Heuser et al.

(10) Patent No.: US 7,278,760 B2
(45) Date of Patent: Oct. 9, 2007

(54) LIGHT-EMITTING ELECTRONIC COMPONENT

(75) Inventors: Karsten Heuser, Erlangen (DE); Karsten Diekmann, Rattenberg (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 179 days.

(21) Appl. No.: 10/853,570

(22) Filed: May 24, 2004

(65) Prior Publication Data
US 2005/0259423 A1 Nov. 24, 2005

(51) Int. Cl.
*F21V 9/00* (2006.01)
*F21V 9/08* (2006.01)

(52) U.S. Cl. .................. 362/293; 362/84; 313/112; 313/501; 359/578

(58) Field of Classification Search ............... 362/293, 362/2, 583, 510, 84, 330; 313/463, 112, 313/580, 498, 501, 506; 359/502, 578, 588, 359/590; 349/18
See application file for complete search history.

(56) References Cited

U.S. PATENT DOCUMENTS

| 5,321,539 | A * | 6/1994 | Hirabayashi et al. | 349/198 |
| 5,347,378 | A * | 9/1994 | Handschy et al. | 349/78 |
| 5,586,879 | A * | 12/1996 | Szpak | 362/293 |
| 6,252,638 | B1 * | 6/2001 | Johnson et al. | 362/293 |
| 2004/0247949 | A1 * | 12/2004 | Akedo et al. | 313/112 |

* cited by examiner

*Primary Examiner*—Sandra O'Shea
*Assistant Examiner*—Bao Q. Truong
(74) *Attorney, Agent, or Firm*—Fish & Richardson P.C.

(57) ABSTRACT

A light-emitting electronic component is described that includes at least one light-emitting element intended for the emission of light with a predetermined spectral distribution, at least one filter element arranged in a beam path of the light with the predetermined spectral distribution, the transmission property of the filter element with respect to the light with the predetermined spectral distribution determining the spectral distribution of the light emitted by the light-emitting component, with the transmission property of the filter element being tunable during operation of the light-emitting electronic component. The color of the light emitted by the component can be tuned by tuning the transmission property of the filter element.

30 Claims, 3 Drawing Sheets

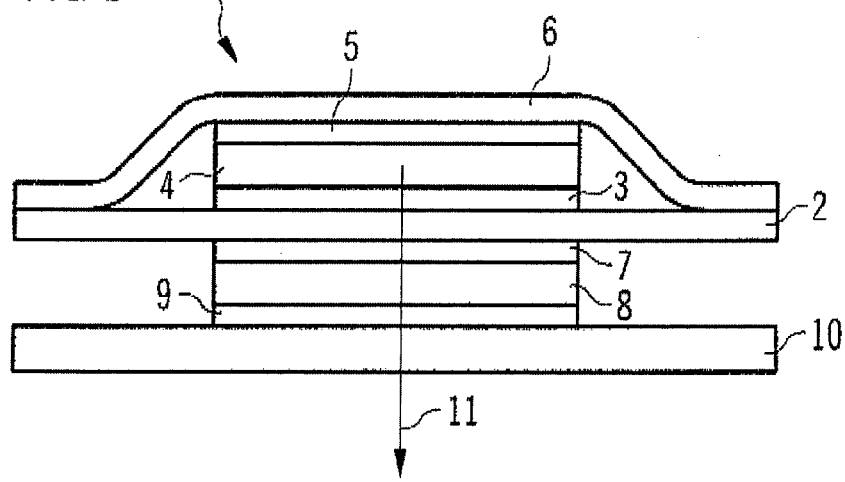
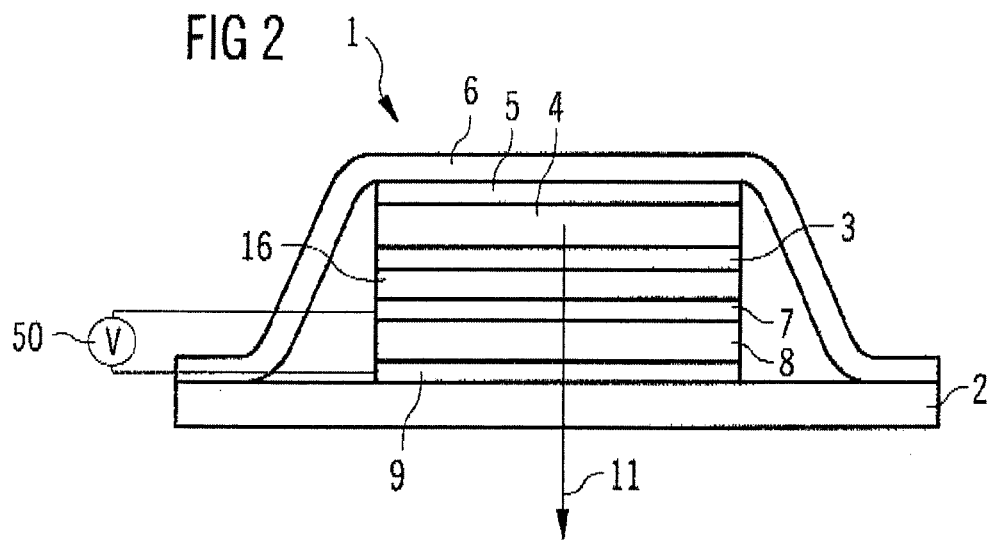
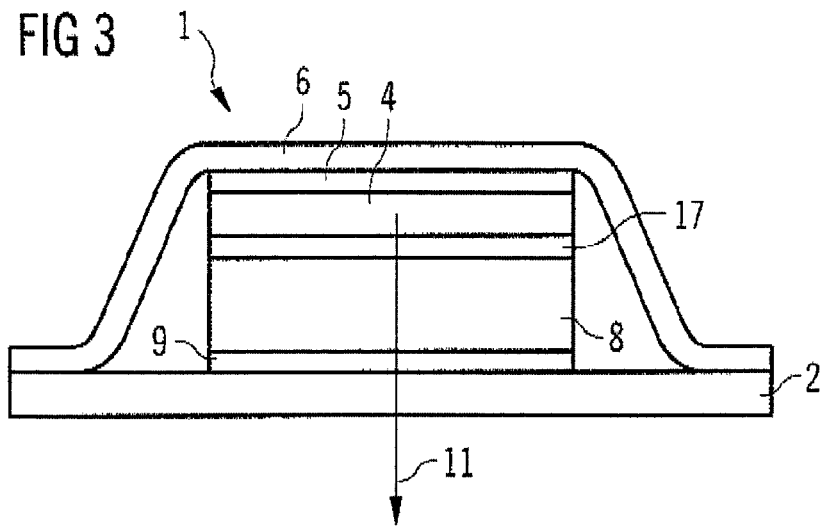

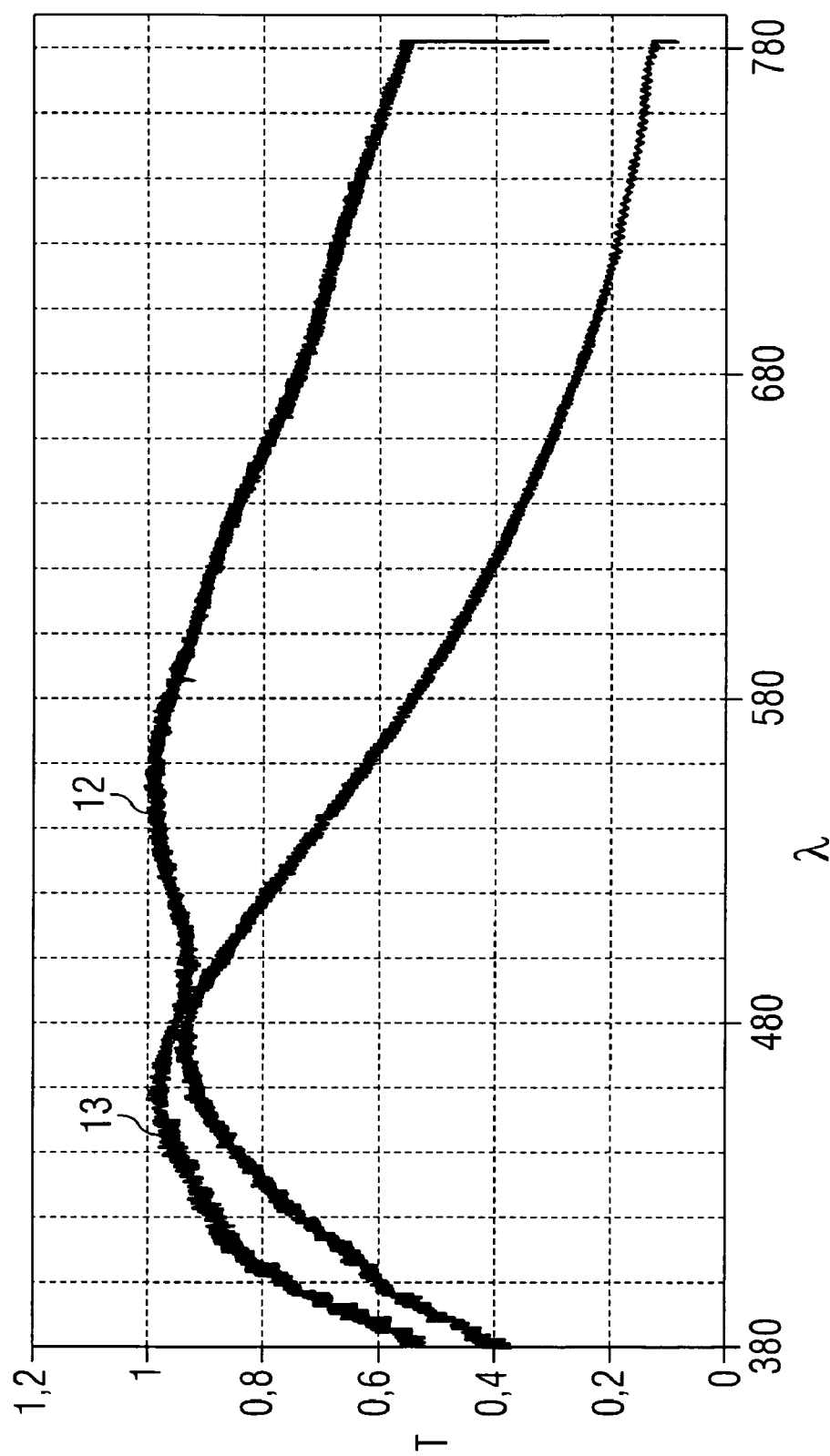

LIGHT-EMITTING ELECTRONIC COMPONENT

The present invention relates to methods and apparatus for forming a tunable light emitting component. Nowadays light-emitting electronic components, in particular opto-electronic components, are often fabricated to emit light of a color in accordance with specific customer requests (Color On Demand). For this purpose, use is often made of a light-emitting electronic component having a comparatively broad spectral distribution, e.g., an appropriate white light source. By using color filters, the color of the light emitted by the component is tailored according to a customer's request. This "custom tailored" color of the light-emitting component is completely determined by the spectral distribution of the light emitted by the component in combination with the absorption properties of the color filter. Since the absorption properties of such filters are usually fixed, e.g., by the filter's dyes, a customer finds it difficult to vary the color of the light emitted by the electronic component without considerable effort.

SUMMARY

A light-emitting electronic component with spectral distribution of light emitted by the component, such that the color of the emitted light is tunable in a simple manner during operation of the component, is described.

In one aspect, the light-emitting electronic component includes at least one light-emitting element and at least one filter element. The light-emitting element emits light with a predetermined spectral distribution within a first range. The filter element is arranged in a beam path of the light emitted from the light-emitting element. The at least one filter element has a transmission property that causes light transmitted by the at least one filter element to have a spectral distribution within a second range. The transmission property of the filter element is tunable during operation of the light-emitting element, such that the second range changes as the filter element is tuned.

Further features, advantages and refinements are described in conjunction with the description of the exemplary embodiments in accordance with the figures.

DESCRIPTION OF THE DRAWINGS

FIG. 1 shows a schematic sectional view of a first exemplary embodiment of a light-emitting electronic component.

FIG. 2 shows a schematic sectional view of a second exemplary embodiment of a light-emitting electronic component.

FIG. 3 shows a schematic sectional view of a third exemplary embodiment of a light-emitting electronic component.

FIG. 4 shows a diagram of the wavelength dependence of the transmission of a filter element for two different voltages.

Corresponding elements and correspondingly acting elements have corresponding numerals in the figures.

DETAILED DESCRIPTION

Figure 5:
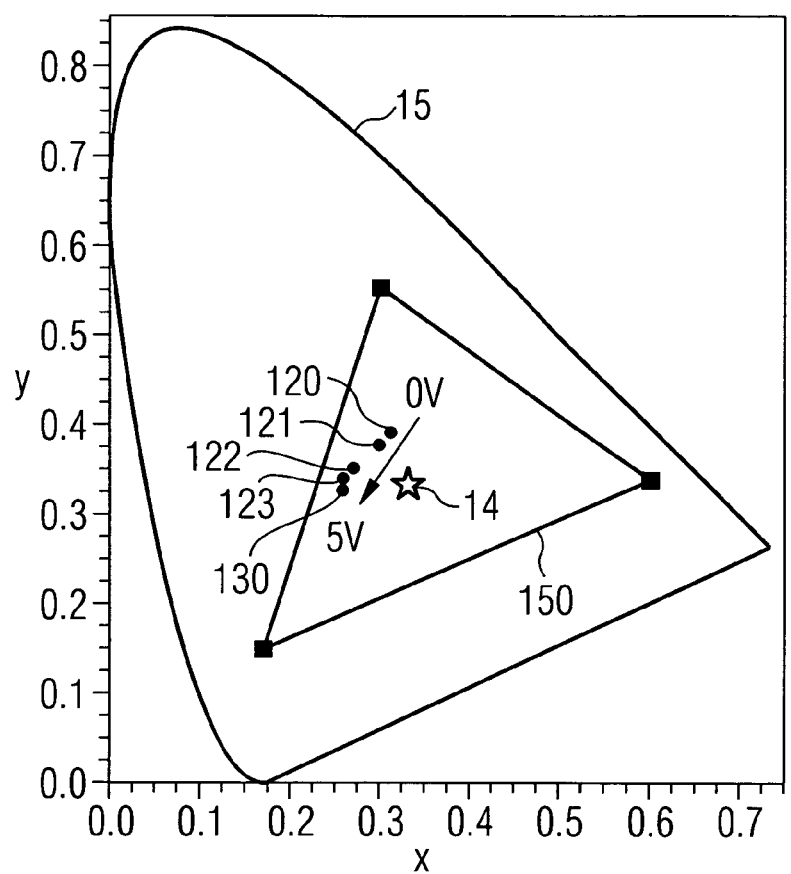
FIG. 5 shows a representation in the CIE-chromacity diagram of the change in colors of the light emitted by the electronic component as a result of tuning the transmission properties of the filter element.

A light-emitting electronic component has a light-emitting element that emits light with a spectral distribution that falls within a range of wavelengths. The spectral distribution of the light can be altered by locating a filter between the light-emitting element and a viewer. It can be desirable to alter the intensity of each wavelength transmitted by the component by changing the transmission properties of the filter, such that the color of the emitted light is tunable during operation of the component. The color of the light emitted by the electronic component is therefore tunable or variable by varying the transmission properties of a filter element. Herein, the term "color" refers to pure or mixed colors and also to white. Pure colored light has color coordinates x and y on the boundary line of the CIE-chromaticity diagram and mixed colored light has color coordinates in the interior of the region bounded by the boundary line.

The predetermined spectral distribution of the light-emitting element can have a comparatively broad band width or broad spectral distribution, particularly in the visible spectral range. This can result in different colors of the light being emitted by the component utilizing light of a single predetermined spectral distribution in combination with different filter elements having different transmission and/or tuning properties.

In one implementation, the electrical component is continuously tunable. Different colors or color nuances can be realized with a single light-emitting electronic component.

Tuning or varying the transmission properties of the filter element can result in varying the spectral distribution of the light emitted by the light-emitting component during operation of the component. The tuning of the transmission properties of the filter element can be reversible.

In one implementation, the predetermined spectral distribution has a continuous shape. The predetermined spectral distribution can have bands in the red, green and/or blue spectral region. Superimposing such bands can result in a predetermined spectral distribution, such as spectral distributions that are continuous and/or having a suitable high broadness. For example, the predetermined spectral distribution can appear white or white with a slight color cast.

In one implementation, the light-emitting element comprises at least one opto-electronic element, emitting light due to electroluminescence in at least one functional material or functional layer. The opto-electronic element may, for example, be formed as an LED structure (Light Emitting Diode) or OLED structure (Organic Light Emitting Device, in particular, an Organic Light Emitting Diode), the OLED-structure containing at least one organic light emitting material.

In one implementation, a filter element is utilized for tuning or varying the peak and/or dominant wavelength of a light-emitting element. In particular, a light-emitting element having a comparatively narrow predetermined spectral distribution, for example, single chip LED elements, which often emit a single band spectrum having a spectral width on the order of nanometers, for example 20 nm to 60 nm, can be tuned with a filter element.

According to another implementation, the transmission properties of the filter element can be tuned electrically. The filter element can be a voltage driven or current driven element, for example different currents, current densities or voltages applied to the filter element can result in distinct changes of the transmission properties of the filter element. The color of a display illuminated by means of a light-emitting electronic component can be tuned or varied externally via external terminals electrically connected to the filter element.

In particular, the color of a monochrome display or an area color display, e.g., an area color self-emitting OLED display or an LCD can be tuned or varied by tuning the transmission properties of the filter element. An area color self-emitting display is usually understood as a display showing different colors in different areas of the display, with the colors of the different areas being usually fixed and/or determined by the color of light emitted, e.g., by OLEDs, in the respective areas of the display.

In one implementation, the filter element contains at least one electrochromic material. Electrochromic materials have transmission properties which can depend on the current injected into and/or the voltage applied to the electrochromic material.

The electrochromic material can be chosen such as to exhibit comparatively high transmission in the visible spectral region, said transmission being electrically tunable. A local or global maximum in transmission of the electrochromic material can be shifted electrically to higher or lower wavelengths. Shifting a transmission maximum to lower wavelengths can result in an increase in absorption in regions of higher wavelengths, e.g., in the red or orange spectral region. Shifting a transmission maximum to higher wavelengths, correspondingly, can result in an increase in absorption in regions of lower wavelengths, e.g., in the blue spectral region.

The electrochromic material can contain at least one inorganic or at least one organic material. An inorganic electrochromic material can, for example, contain a metal-oxide, e.g., tungsten-oxide. An organic electrochromic material can, for example, contain at least one polythiophene or other polymeric materials. The organic material can contain PEDOT (Polyethylenedioxythiophene).

According to another implementation, the light-emitting element and the filter element are integrated in a common structure, such as a common layer stack. This facilitates the formation of particularly small or compact light-emitting electronic components.

In one implementation, the light-emitting element and/or the filter element are arranged in a housing. This housing can includes an LED or OLED package, an encapsulation and/or a sealing means, for example. A sealing means is particularly useful for light-emitting elements comprising organic light-emitting materials because the organic materials are often very sensitive to moisture or oxidizing agents and can be protected by the sealing means. The housing can protect the light-emitting element and/or the filter element. The filter element and the light-emitting element can be arranged in a common housing.

In another implementation the light-emitting electronic component includes electrically conducting leads conductively connected to the light-emitting element and/or the filter element. The leads are conductively connected to external terminals, by which the electronic, such as microelectronic and/or opto-electronic, component can be actuated externally. In one implementation the electronic component is mounted on a circuit board and/or integrated in an application, such as illuminating an LCD-display in an LCD-display-housing or for a roof panel illumination of a car.

The light-emitting element and the filter element can be actuated independently from one another during operation of the light-emitting component. The filter element and the light-emitting element can be electrically insulated from one another and/or have separate means for electrical contact connection.

Alternatively, the filter element and the light-emitting element can be conductively connected to one another and/or have a common electrode that is arranged between the light-emitting element and the filter element. The electrode can be integrated together with the filter element and the light-emitting element in a common layer stack. The common electrode can be utilized for commonly operating the filter element and the light-emitting element.

FIG. 1 shows a schematic sectional view of a first exemplary embodiment of a light-emitting electronic component.

The light-emitting component 1 includes a window 2, a first electrode 3 arranged on the window followed by an light-emitting layer 4 which is conductively connected to the first electrode 3. A second electrode 5 is arranged on and conductively connected to the light-emitting layer 4 and an encapsulation 6 is provided for increased protection of the light-emitting layer against harmful environmental influences.

A filter element is arranged on the window 2 opposite from the light-emitting element, the filter element comprising a first contact 7 arranged on the window, a filter layer 8 conductively connected to the first contact 7 and a second contact 9 arranged on the filter layer 8 and conductively connected to the filter layer 8, the second contact 9 in turn being arranged on a carrier 10.

A light-emitting element that includes the light-emitting layer 4 and the electrodes 3, 5 can, for example, be formed as an OLED-structure, and/or the light-emitting layer 4 can include an organic light emitting material. For example, the light-emitting layer can contain an organic polymeric material, e.g., a polyspiro material.

The light-emitting layer can be arranged in a layer stack, and the layer stack can include at least one additional light-emitting layer and/or other additional layers. In case of an organic light-emitting layer, said layer stack can be formed as an organic layer stack, which can additionally include a hole transport layer, for example. The hole transport layer can increase the efficiency of the light-generation in the organic layer stack, especially in the light-emitting layer, by raising the efficiency of hole injection into the light-emitting layer, where electrons and holes recombine and generate light by means of electroluminescence.

Carrier 10 and window 2 can each or respectively comprise an essentially transparent and/or electrically insulating material, for example, a glass material or a flexible substrate material, e.g., PES (polyethersulfone) or PET (polyethyleneterephtalate). Carrier 10 and window 2 can comprise identical materials. The window 2 acts as a window for the light of the predetermined spectral distribution generated in the light-emitting layer and as a carrier which mechanically stabilizes the light-emitting element structure arranged on the window 2.

The carrier 10 can act as a carrier for the filter element, including the contacts 7, 9 and the filter layer 8, and due to the light-emitting element structure arranged on the filter element carrier 10, can act as a carrier stabilizing the light-emitting component 1. The carrier 10 can also protect the filter element. Additional protection means, e.g., a sealing means or an encapsulation, can also be provided for the filter element, but are not shown in the figures.

The electrodes 3, 5 and/or the contacts 7, 9 can, for example, include a transparent material, such as a TCO-material (Transparent Conducting (Oxide), e.g., ITO (Indium Tin Oxide).

The encapsulation 6 can be made of a suitable material, e.g., a suitable sealing material for organic materials known in the field of organic light-emitting devices.

The filter layer 8 contains at least one inorganic electrochromic material, for example $WO_3$.

Light of a predetermined spectral distribution generated via electroluminescence in the light-emitting layer 4 is radiated through the electrode 3, the window 2 and first contact 7, the filter layer 8, the second contact 9 and the carrier 10. By applying a voltage to the filter layer 8, which results in current injection into the filter layer 8, the transmission properties of the filter material are changed. This change in transmission properties results in a change in the spectral distribution of the light 11 emitted by the electronic component 1.

The light of the predetermined spectral distribution can be white light or light of another color having a suitably broad spectral distribution. White light, for example, can be created by mixing light of different wavelengths emitted by suitable chromophores provided in the organic light emitting material. With a polyspiro material that emits in the blue wavelength range, red and green chromophores can be integrated in a copolymer structure, with the mixture of these primary colors (e.g., red, green and blue) resulting in a white light emission of the light-emitting element.

The spectral distribution and/or the color of the light emitted by the electronic component can be influenced by electrically varying or tuning the transmission properties of the filter material.

The intensity of the light emitted by the electronic component can be influenced by appropriate formation of the filter element. In particular, the thickness of the filter layer 8 determines the absorption of light and hence the intensity transmitted through the filter element. In this way, the filter element can be adapted to the specific needs of various embodiments of the light-emitting electronic component.

The intensity of the light of the predetermined spectral distribution can also be influenced by varying the current density that the light-emitting element is driven with. Decreasing current densities usually correspond to a decrease in intensity of the light generated in the light-emitting layer thereby varying the intensity of the light emitted by the electronic component.

The light-emitting element and the filter element can be operated independently by means of the electrodes 3, 5 and the contacts 7, 9 respectively. The contacts 7, 9 and the electrodes 3, 5 can be insulated from each other with the window 2. Brightness and color coordinates of the light 11 emitted by the electronic component 1 are independently adjustable or tunable. Brightness can be adjusted by adjusting the operating current of the light-emitting element transmitted to the electrodes 3, 5 and the color coordinates can be adjusted by the filter element through the contacts 7, 9.

The light-emitting element can, in this exemplary embodiment, be formed according to a conventional light-emitting electronic component and the filter element can be provided externally, i.e., outside of the light-emitting element structure. The filter element can be arranged inside an encapsulation or on a window of the light-emitting element, for example. This results in comparatively high variability in applications of the light-emitting element, because the filter element can be provided after completing the production of the light-emitting element.

FIG. 4 shows quantitatively the dependency of the relative transmission T from the wavelength λ of a W03-containing filter element for two different voltages. The relative transmissions are normalized to a value of 1 at corresponding maxima in transmission.

Graph 12 shows the transmission of a $WO_3$ containing filter element for zero voltage applied to the contacts 7, 9. The transmission according to graph 12 has comparatively high values, of approximately 0.6 or more, in the visible spectral region with particularly high values in the green or yellow region and a maximum at approximately 550 nm.

Graph 13 shows the transmission of a $WO_3$ containing filter element with 5V applied voltage and current flowing through the filter element. In comparison with graph 12, the transmission is significantly lowered in graph 13 in the visible spectral range, in particular in the orange and red spectral region. The transmission is lowered by 50% or more for wavelengths higher than approximately 600 nm. The transmission maximum in graph 13 lies at approximately 460 nm.

If essentially pure white light having a suitable broad spectral distribution, e.g., white light generated by electroluminescence in an organic polyspiro copolymer light-emitting layer with suitable chromophores, is transmitted through the filter element having the transmission properties of graph 12, the amount of light transmitted in the green and yellow spectral region is compared to the outer visible spectral regions blue and red. This results in the initially transmitted essentially pure white light having a white color with a greenish yellowish color cast.

The color of light emitted by an electronic component, e.g., an electronic component as shown in FIG. 1, with zero voltage being applied to a $WO_3$ electrochromic filter layer 8 having the transmission properties as shown in FIG. 4, is represented by point 120 in the CIE-chromaticity diagram shown in FIG. 5. Point 120 has the coordinates x=0.31 and y=0.39 corresponding to a white light having a yellow or 30 green shade of color.

Pure white light is represented by the white point 14 having coordinates x=y=⅓ in the CIE-chromaticity diagram bounded by the boundary line 15. Colors in the inner area or on the boundary of triangle 150 can be mixed by use of two or three colors having coordinates corresponding to the corners of the triangle.

As the voltage is increased from 0V to 5V, the light emitted by the electronic component changes, as indicated by the arrow, its color coordinates continuously from point 120 over point 121, point 122, point 123 to point 130. Point 130 has the color coordinates x=0.26 and y=0.33 and appears as white with a turquoise color cast, due to the absorption being rather high in the red and orange spectral region according to graph 13.

The color coordinates of the light emitted by the electronic component 1 can be varied. If an electronic component described herein is used as an ambient light source, the color of the ambient light is tunable. If $WO_3$, for example, is used as electrochromic filter material, the color of initially white light emitted by the light-emitting layer can be varied, from a rather cool, turquoise shaded white, to a rather warm, yellow or green shaded white, and vice versa. A single ambient light-emitting electronic component may thus be used to generate different ambient light caused moods. Cool light, for example is particularly useful as illumination at a workplace and is thought to increase an employee's efficiency at work, whereas warm light generally evokes a leisurely mood.

Because the transmission properties of the filter element can be varied electrically and reversibly, the light emitted by the component can be switched and/or continuously tuned between different colors. The intensity of the light emitted by the electronic component can additionally be influenced by the operating current of the light-emitting element, resulting in the light-emitting component being color tunable and dimmable.

FIG. 2 shows a schematic sectional view of a second exemplary embodiment that, in contrast to the exemplary embodiment of FIG. 1, the light-emitting layer 4 and the filter layer 8 are integrated in a common layer stack in the embodiment according to FIG. 2. In this way, a small and compact form of the light-emitting component is achieved.

The filter layer 8 and the light-emitting layer 4 can be formed separately from one another and joined after completing their production. Between the light-emitting layer and the filter layer an insulating layer 16 is arranged, which electrically insulates electrodes 3, 5 and contacts 7, 9 from one another. The light-emitting element and the filter element can therefore be operated separately. In one implementation, the light-emitting component 1 includes a voltage source 50 configured to provide two or more different voltages to the filter layer 8, for example, through the contact layers 7 and 9.

The insulating layer 16 includes, for example, a silicon-oxide ($SiO_x$) or titanium-siliconoxide ($TiSiO_x$), with x having values, such as integer values, satisfying the condition $1 \leq x \leq 4$.

The layer stack is mechanically stabilized by means of window 2 and protected by the encapsulation 6.

Integration of the filter element and the light-emitting element in a common layer stack facilitates the protection of the filter element and the light-emitting element with a common protection means, for example an encapsulation 6.

FIG. 3 shows a schematic sectional view of a third exemplary embodiment. A common electrode 17 is arranged between and conductively connected with the filter layer 8 and the light-emitting layer 4. The light-emitting element can be operated by means of the second electrode 5 and a common electrode 17. The transmission properties of the filter element can be varied by applying a voltage to the filter element by the common electrode 17 and the second contact 9. The difference in the electrical potential between common electrode 17, e.g., the anode of an organic light emitting diode structure, and the contact 9 can be tuned by varying the electrical potential on the contact 9.

The light-emitting component according to this embodiment can be formed with and operated by three external terminals, two for the light-emitting element that are connected to second electrode 5 and the common electrode 17 and one terminal connected to the second contact 9 for electrically tuning the transmission properties of the filter element. In comparison with the embodiments in FIGS. 1 and 2, one external electrical terminal, i.e., a terminal connected to the first contact 7 shown in FIGS. 1 and 2, can be dispensed with.

Figure 6:
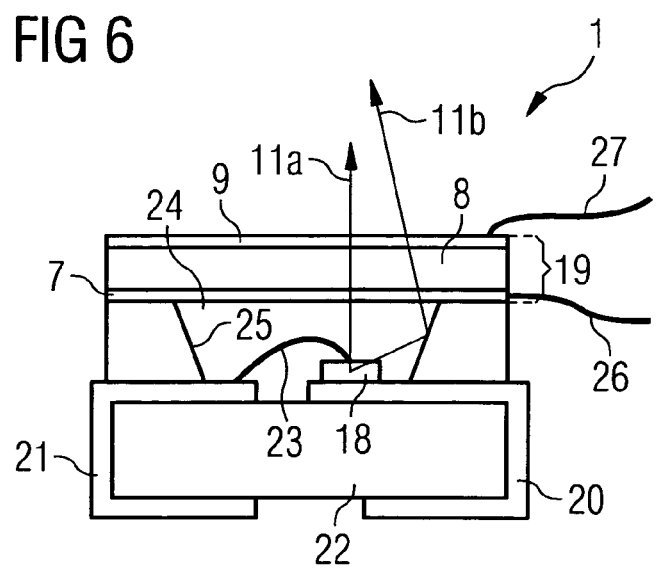
FIG. 6 shows a schematic sectional view of a forth exemplary embodiment of a light-emitting electronic component.

FIG. 6 shows a schematic sectional view of a forth exemplary embodiment of a light-emitting electronic component.

The light-emitting element includes at least one LED-chip 18, which can include at least one semiconductor material, such as a III-V-semiconductor material and/or a crystalline semiconductor material. The LED-chip can be arranged in a recess 24 of a housing 22, such as a housing of a plastic material. The LED-chip is conductively connected to leads 20, 21 by suitably mounting and/or fixing the LED-chip on a lead 20, e.g., with a conductive adhesive or soldering, and a bonding wire 23 conductively connected to the lead 21. The wall 25 of the recess 24 can be coated fully or partly with a reflection enhancing material, e.g., a metal. The light-emitting element can thus be formed as a surface mountable device (SMD), for example, mountable on a circuit board with leads 20 and 21.

Light 11a and 11b generated in the LED-chip 18 by electroluminescence is emitted by component 1 after transmission through the filter element 19. The filter element includes the contacts 7, 9 and the filter layer 8, which can include an electrochromic material, for example. Light 11b is reflected by wall 25 of recess 24 before incidence on the filter element. The transmission properties of the filter layer 8 are electrically tunable through leads 26 and 27 that are conductively connected to the filter layer.

The light of the predetermined spectral distribution generated by the light-emitting element can be essentially white or a mixed colored. White light can be generated by suitably mixing light emitted by a plurality of LED Chips. The LED chips can be arranged in a common housing and can emit in the red, green and blue spectral region, for example. The LED-chips can have separate leads allowing individual operating of each LED-chip.

White light can also be generated by luminescence conversion of a part of light of a first wavelength emitted by a single LED-chip to light of a longer wavelength, with an appropriate luminescence conversion material, e.g., a phosphor material, arranged in the recess. The mixture of these two lights can result in white light. For this purpose, the LED-chip can emit in the blue or ultraviolet spectral region and the light reemitted by the conversion material can be in the yellow or orange spectral region.

The filter element is arranged layer-like on and can be mechanically fixed to the housing 22 of the light-emitting element. The light-emitting element and filter element can be operated independently by means of terminals connected to the leads 20, 21 and 26, 27 respectively. The recess can be partly or fully filled with a protection material, e.g., silicone, for increased protection of the LED-chip. This protection material can be formed simultaneously as a carrier material for luminescence conversion particles arranged in or on the material, if luminescence conversion is intended.

The scope of the invention is not limited to the exemplary embodiments described herein. The invention is embodied in each novel characteristic and each combination of characteristics which includes every combination of any features which are stated in the claims, even if the feature or this combination of features is not explicitly stated in the claims or in the exemplary embodiments.

In particular, a light-emitting electronic component according to the invention can comprise more than one filter element. The light-emitting element can, for example, be arranged between two layer-like filter elements or a plurality of filter elements can be arranged successively in the beam path of the light emitted by the light-emitting element. Furthermore the filter material does not have to be provided in a layer-like fashion, it may also be provided in another way, e.g., by means of a fluid suitably provided with particles of the filter material with the transmission properties of the filter particles being tunable, such as electrically tunable.

What is claimed is:

1. A light-emitting electronic component, comprising:
a light-emitting element including a light emitting layer connected to and disposed between a first electrode and a second electrode for emitting light with a predetermined first spectral distribution; and
a filter element including a filter layer connected to and disposed between a first electrically conductive contact layer and a second electrically conductive contact layer, and arranged in a beam path of the light,
wherein the filter layer is operable to cause the light transmitted therethrough to have a second spectral distribution,
wherein the filter element is tunable during operation of the light-emitting element, such that the second spectral distribution of the light passing through the filter element changes as the filter element is tuned, and
wherein the light emitting layer, the first electrode, the second electrode, the filter layer, the first electrically conductive contact layer and the second electrically conductive contact layer form a multi-layer stacked structure.

2. The component according to claim 1, wherein a color of the light transmitted by the filter element is tunable by means of tuning the filter element.

3. The component according to claim 1, wherein the light-emitting element includes at least one opto-electronic element.

4. The component according to claim 1, wherein the light-emitting element includes at least one organic light emitting material.

5. The component according to claim 1, wherein the light-emitting element includes an organic light emitting diode structure.

6. The component according to claim 1, wherein the filter element is electrically tunable.

7. The component according to claim 1, wherein the filter element contains at least one electrochromic material.

8. The component according to claim 7, wherein the electrochromic material contains at least one inorganic material.

9. The component according to claim 8, wherein the inorganic material is a tungsten oxide.

10. The component according to claim 7, wherein the electrochromic material contains at least one organic material.

11. The component according to claim 1, wherein the light-emitting element and the filter element are integrated in a common layer stack.

12. The component according to claim 1, wherein the light-emitting element and the filter element are arranged in a common housing.

13. The component according to claim 1, wherein the light-emitting element and the filter element are independently actuatable from one another.

14. The component according to claim 1, wherein the light-emitting element and the filter element are commonly actuatable.

15. A method for forming a light-emitting electronic component, comprising:
forming at least one light-emitting element including a light emitting layer connected to and disposed between a first electrode and a second electrode for emitting light with a predetermined first spectral distribution on a substrate; and
forming at least one filter element including a filter layer connected to and disposed between a first electrically conductive contact layer and a second electrically conductive contact layer such that the at least one filter element is in a beam path of the light emitted from the at least one light-emitting element, the at least one filter element causing light transmitted by the at least one filter element to have a different, second spectral distribution,
wherein the filter element is tunable during operation of the light-emitting element, such that the second spectral distribution of the light passing through the filter element changes as the filter element is tuned, and
wherein the light emitting layer, the first electrode, the second electrode, the filter layer, the first electrically conductive contact layer and the second electrically conductive contact layer form a multi-layer stacked structure.

16. The method of claim 15, wherein:
forming the at least one light-emitting element includes forming the at least one light-emitting element on a first surface of the substrate; and
forming the at least one filter element includes forming the at least one filter element on a second surface of the substrate.

17. The method of claim 15, wherein forming the at least one filter element includes forming the at least one filter element on the at least one light-emitting element.

18. The method of claim 15, further comprising conductively coupling the at least one filter element to a voltage source, wherein the voltage source is capable of applying two or more different voltages to the at least one filter element.

19. The component according to claim 13, wherein the light-emitting element and the at least one filter element are independently actuatable during operation.

20. The component according to claim 14, wherein the light-emitting element and the at least one filter element are commonly actuatable during operation.

21. The component according to claim 13, wherein the light emitting layer is an organic-layered stack including a hole transport layer.

22. The component according to claim 13, wherein the light emitting layer, the first electrode and the second electrode are arranged on a window operable to allow light having the first spectral distribution to be transmitted to the filter element.

23. The component according to claim 22, wherein the filter layer, the first contact layer and the second contact layer are positioned on a carrier to mechanically stabilize the light emitting element arranged on the window.

24. The component according to claim 1, wherein at least one of the first electrode and the second electrode includes transparent material.

25. The component according to claim 1, wherein the filter element consists essentially of the filter layer.

26. The component according to claim 1, further comprising a window positioned between the first electrode and the first contact layer, wherein the window is operable to allow light emitted with the first spectral distribution to be transmitted therethrough.

27. The component according to claim 1, further comprising a window positioned adjacent to the second contact layer, wherein the window is operable to allow light emitted with the second spectral distribution to be transmitted therethrough.

28. The component according to claim 11, wherein the common layer stack is disposed on a common carrier.

29. The component according to claim 1, wherein a voltage is applied to the filter layer through the first electrically conductive contact layer and the second electrically conductive contact layer.

30. The component according to claim 1, wherein the first electrode and the first electrically conductive contact layer are a common electrode.

* * * * *